United States Patent
Whiteman et al.

(10) Patent No.: US 10,938,411 B1
(45) Date of Patent: Mar. 2, 2021

(54) COMPRESSION AND/OR DECOMPRESSION OF ACTIVATION DATA

(71) Applicant: Arm Limited, Cambridge (GB)

(72) Inventors: Derek David Whiteman, Lund (SE); Erik Persson, Lund (SE); Tomas Fredrik Edsö, Lund (SE)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/829,879

(22) Filed: Mar. 25, 2020

(51) Int. Cl.
  *H03M 7/40* (2006.01)
  *H03M 7/30* (2006.01)
  *G06N 3/02* (2006.01)

(52) U.S. Cl.
  CPC ............ *H03M 7/4075* (2013.01); *G06N 3/02* (2013.01); *H03M 7/3071* (2013.01); *H03M 7/6011* (2013.01); *H03M 7/70* (2013.01)

(58) Field of Classification Search
  CPC .... H03M 7/4075; H03M 7/6011; H03M 7/70; G06N 3/02
  USPC .......................................... 341/107, 106, 87
  See application file for complete search history.

(56) References Cited

U.S. PATENT DOCUMENTS

| | | | |
|---|---|---|---|
| 10,726,336 B2* | 7/2020 | Chen | ........................ G06N 3/00 |
| 10,762,426 B2* | 9/2020 | Li | ........................ G06N 3/0445 |
| 10,784,892 B1* | 9/2020 | Lan | ..................... H03M 13/1117 |

OTHER PUBLICATIONS

Wikipedia; FELICS, retrieved from "https://en.wikipedia.org/w/index.php?title=FELICS&oldid=941891110", last edited on Feb. 21, 2020.
Howard et al: "Fast and Efficient Lossless Image Compression", proceedings of IEEE Computer Society/NASA/CESDIS Data Compression Conference, Snowbird, Utah, Mar. 30-Apr. 1, 1993, pp. 351-360.
Georgiadis et al: "Accelerating Convolutional Neural Networks via Activation Map Compression", IEEE, 2019.

* cited by examiner

*Primary Examiner* — Brian K Young
(74) *Attorney, Agent, or Firm* — EIP US LLP

(57) ABSTRACT

A method for compressing activation data of a neural network to be written to a storage is provided. The activation data is formed into a plurality of groups and a state indicator indicates whether there are any data elements within each group that have a non-zero value. A second state indicator indicates, for groups having a non-zero value, whether sub-groups within the group contain a data element having a non-zero value. A sub-group state indicator indicates, for each sub-group having a non-zero value, which data elements within that sub-group have a non-zero value. Non-zero values of data elements in the activation data are encoded and a compressed data set is formed comprising the first state indicators, any second state indicators, any sub-group state indicators and the encoded non-zero values.

14 Claims, 17 Drawing Sheets

Divisor = 3

| Value | Quotient | Remainder | GR code |
|---|---|---|---|
| 0 | 0 | 0 | 000 |
| 1 | 0 | 1 | 001 |
| 2 | 0 | 2 | 010 |
| 3 | 1 | 0 | 1000 |
| 4 | 1 | 1 | 1001 |
| 5 | 1 | 2 | 1010 |
| 6 | 2 | 0 | 11000 |
| 7 | 2 | 1 | 11001 |
| 8 | 2 | 2 | 11010 |
| 9 | 3 | 0 | 111000 |
| 10 | 3 | 1 | 111001 |

Fig. 1

| Scheme | Meaning |
|---|---|
| 0 | Raw |
| 1 | Zero |
| 2 | Delta GRC 1 |
| 3 | Delta GRC 2 |
| 4 | Delta GRC 3 |
| 5 | Delta GRC 4 |
| 6 | Delta GRC 5 |
| 7 | Mask Delta GRC 1 |
| 8 | Mask Delta GRC 2 |
| 9 | Mask Delta GRC 3 |
| 10 | Mask Delta GRC 4 |
| 11 | Mask Delta GRC 5 |
| 12 | Inv Mask Delta GRC 2 |
| 13 | Inv Mask Delta GRC 3 |
| 14 | Inv Mask Delta GRC 4 |
| 15 | Inv Mask Delta GRC 5 |

Fig. 3b

|  | Transmit raw |
|  | Predict from left |
|  | Predict from top |
|  | Merge (3*left + 3*top + 2*topleft)/8 |

| 0 | 0 | 0 | 0 |
|---|---|---|---|
| 0 | 0 | 0 | 3 |
| 1 | 0 | 11 | 22 |
| 0 | 0 | 23 | 24 | elem

|   | 0 | 0 | 0 |
|---|---|---|---|
| 0 | 0 | 0 | 0 |
| 0 | 0 | 0 | 5 |
| 1 | 0 | 4 | 19 | pred

| 0 | 0 | 0 | 0 |
|---|---|---|---|
| 0 | 0 | 0 | 3 |
| 1 | 0 | 11 | 17 |
| -1 | 0 | 19 | 5 | delta

Fig. 5

Mask 4X4 =   1110

Mask 2X2 =   11111110
             1000

Mask 1X1 =   0001000101011101
             111110111100
             1101

Inverse

Mask 4X4 =    1111

Mask 2X2 =    11110111
              11111111

Mask 1X1 =    0001000101011101
              101111000000
              1101000000000000
              0000000000000000

|   | 2 | 2 | 2 | 2 | 2 | 2 | 2 |
|---|---|---|---|---|---|---|---|
| 1 | 3 | 4 | 5 | 6 | 7 | 8 | 9 |
| 1 | 4 | 5 | 6 | 7 | 8 | 9 | 10 |
| 1 | 5 | 6 | 7 | 8 | 9 | 10 | 11 |
| 1 | 6 | 7 | 8 | 9 | 10 | 11 | 12 |
| 1 | 7 | 8 | 9 | 10 | 11 | 12 | 13 |
| 1 | 8 | 9 | 10 | 11 | 12 | 13 | 14 |
| 1 | 9 | 10 | 11 | 12 | 13 | 14 | 15 |

Fig. 16

COMPRESSION AND/OR DECOMPRESSION OF ACTIVATION DATA

BACKGROUND OF THE INVENTION

Field of the Invention

The invention relates to compression and/or decompression of activation data, and more particularly to compression and/or decompression of activation data from a neural network or the like.

Description of the Related Technology

One way of performing lossless data compression is to convert values into Golomb Rice codes. In order to convert a numerical value into a Golomb Rice code a parameter, known as a divisor, is selected. To create the Golomb Rice code, the numerical value is divided by the divisor to generate two parts. A first part is the quotient, which is how many times the divisor will divide completely into the numerical value. The second part is a remainder, which is the remaining amount, if any, after dividing the divisor completely into the numerical value.

Examples of Golomb Rice codes are shown in FIG. 1. In the examples shown in FIG. 1, values between 0 and 10 are shown as Golomb Rice codes. The first portion of the Golomb Rice code, the quotient, is represented in unary format. In this format, the number is represented by a number of '1's equal to the quotient value and the followed by a stop bit, which is a '0'. For example, the unary portion of the number 9 is '1110' which is three '1's followed by the stop bit '0' because 3 divides into 9 three times. The second portion of the Golomb Rice code is a fixed length binary portion. As the divisor in this example is '3', the remainder can only be 0, 1, or 2. Accordingly, this can be represented by a fixed length binary of two bits. The last two bits in each of the Golomb Rice codes represents the remainder in binary form. The remainder may be referred to as the 'mantissa' of the Golomb Rice code because it appears after the stop bit of the unary portion of the Golomb Rice code.

Neural networks are also known in the art. In a neural network, the activation function is responsible for transforming the summed weighted input from a node into the activation of the node. Activation values from multiple nodes form an activation map. When hardware executes a neural network, every activation value may need to be saved to and loaded from a storage, possibly multiple times. A paper entitled 'Accelerating Convolutional Neural Networks via Activation Map Compression' by Georgios Georgiadis of Samsung Semiconductor, Inc. published by the Computer Vision Foundation describes activation map compression using an entropy coding algorithm that is a variant of exponential-Golomb encoding.

In view of the above, improved methods of compressing activation data are desirable in order to improve processing efficiency for neural networks.

SUMMARY

According to a first aspect there is provided a method performed by a processing element for compressing activation data of a neural network to be written to a storage, wherein the activation data is formed of units of data elements, each unit comprising a plurality of data elements and each data element having a numerical value, the method comprising: forming a plurality of groups of data elements within a unit of activation data, each group including a plurality of data elements; identifying whether there are any data elements within each group that have a non-zero value and forming a first state indicator for each group that indicates whether that group contains data elements having a non-zero value; forming a plurality of sub-groups within each group of data elements that was identified as containing at least one data element having a non-zero value; identifying whether there are any data elements having a non-zero value within each sub-group and forming a second state indicator that indicates for each sub-group whether the sub-group contains a data element having a non-zero value; for each sub-group containing a data element having a non-zero value, forming a sub-group state indicator for that sub-group that indicates which data elements within that sub-group have a non-zero value; encoding the non-zero values of data elements in the unit of data; and forming a compressed data set comprising the first state indicators, any second state indicators, any sub-group state indicators and the encoded non-zero values.

According to a second aspect there is provided a method performed by a processing element for compressing activation data of a neural network to be written to a storage, wherein the activation data is formed of units of data elements, each unit comprising a plurality of data elements and each data element having a numerical value, the method comprising: forming a plurality of groups of data elements within a unit of activation data, each group including a plurality of data elements; identifying whether there are any data elements values within each group that have a zero value and forming a first state indicator for each group that indicates whether that group contains data elements having zero values; forming a plurality of sub-groups within each group of data elements that was identified as containing at least one data element having a zero value; identifying whether there are any data elements having a zero value within each sub-group and forming a second state indicator that indicates for each sub-group whether the sub-group contains a data element having a zero value; for each sub-group containing a data element having a zero value, forming a sub-group state indicator for that group that indicates which data elements within that sub-group have a zero value; encoding the non-zero values of data elements in the unit of data; and forming a compressed data set comprising the first state indicators, any second state indicators, any sub-group state indicators and the encoded non-zero values.

According to a third aspect there is provided a data processing system comprising a processing element and a storage, the storage storing code portions that, when executed by the processing element, cause the data processing system to perform a method of compressing activation data of a neural network, wherein the activation data is formed in units of data elements, each unit comprising a plurality of data elements and each data element having a numerical value, the method comprising: forming a plurality of groups of data elements within a unit of activation data, each group including a plurality of data elements; identifying whether there are any data elements within each group that have a non-zero value and forming a first state indicator for each group that indicates whether that group contains data elements having a non-zero value; forming a plurality of sub-groups within each group of data elements that was identified as containing at least one data element having a non-zero value; identifying whether there are any data elements having non-zero value within each sub-group and forming a second state indicator that indicates for each sub-group whether the sub-group contains a data element having a non-zero value; for each sub-group containing a data element having a non-zero value, forming a sub-group state indicator for that sub-group that indicates which data elements within that sub-group have a non-zero value; encoding the non-zero values of data elements in the unit of data; and forming a compressed data set comprising the first state indicators, any second state indicators, any sub-group state indicators and the encoded non-zero values.

BRIEF DESCRIPTION OF THE DRAWINGS

The present technique will be described further, by way of example only, with reference to the embodiments as illustrated in the accompanying drawings, in which:

FIG. 1 is a table of Golomb-Rice codes;

FIG. 3b is a table showing a plurality of compression schemes that can be used for compressing activation data;

FIG. 5 shows a worked example of delta-encoding of activation data;

FIG. 16 shows a processing order for recovering delta-encoded activation data.

DETAILED DESCRIPTION OF CERTAIN INVENTIVE EMBODIMENTS

Figure 2:
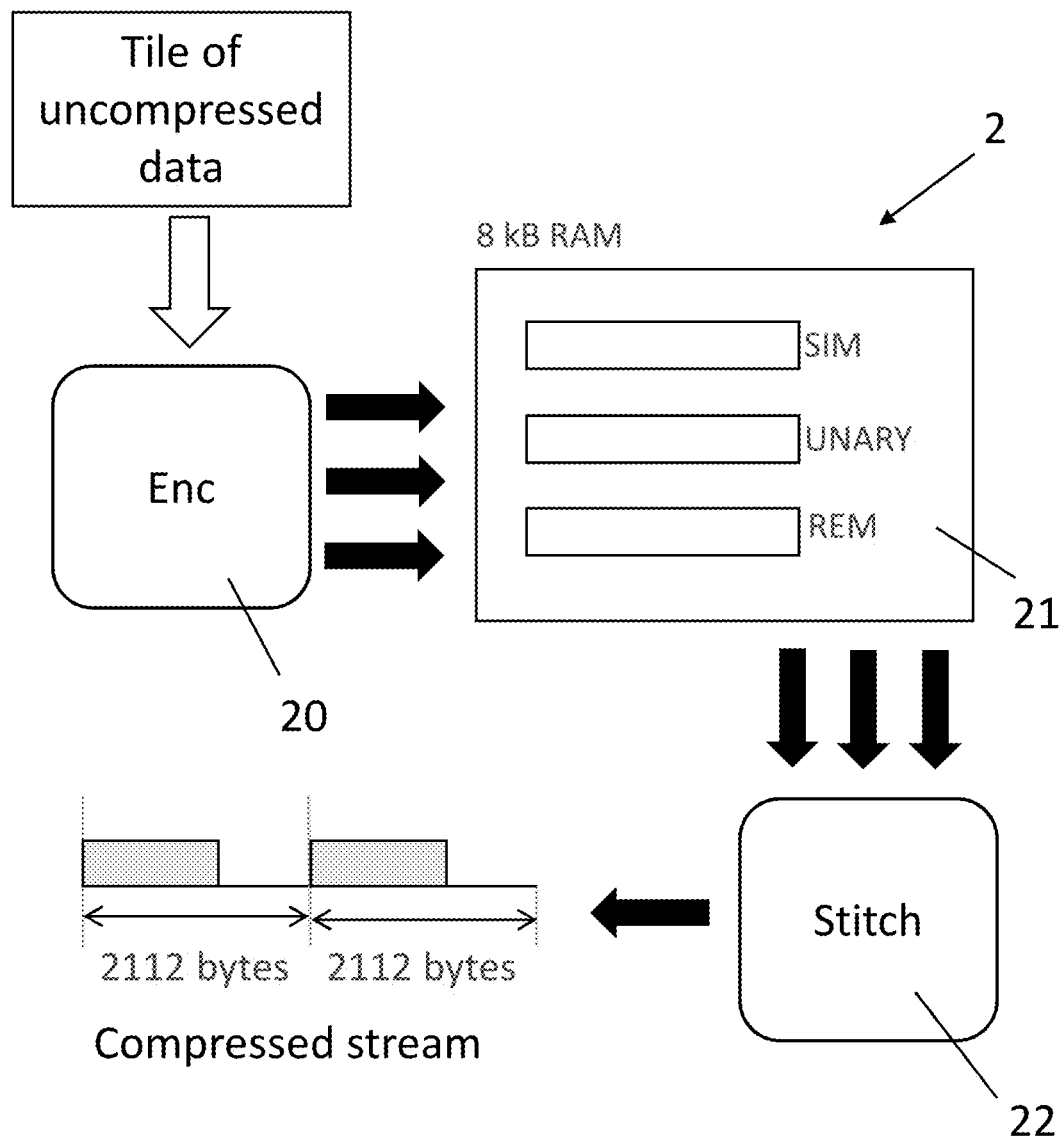
FIG. 2 shows components of a neural processing unit.

Before discussing the embodiments with reference to the accompanying figures, the following description of embodiments and associated advantages is provided.

In accordance with one embodiment there is provided a method performed by a processing element for compressing activation data of a neural network to be written to a storage, which activation data is formed of units of data elements, each unit comprising a plurality of data elements and each data element having a numerical value, the method comprising: forming a plurality of groups of data elements within a unit of activation data, each group including a plurality of data elements; identifying whether there are any data elements within each group that have a non-zero value and forming a first state indicator for each group that indicates whether that group contains data elements having a non-zero value; forming a plurality of sub-groups within each group of data elements that was identified as containing at least one data element having a non-zero value; identifying whether there are any data elements having a non-zero value within each sub-group and forming a second state indicator that indicates for each sub-group whether the sub-group contains a data element having a non-zero value; for each sub-group containing a data element having a non-zero value, forming a sub-group state indicator for that sub-group that indicates which data elements within that sub-group have a non-zero value; encoding the non-zero values of data elements in the unit of data; and forming a compressed data set comprising the first state indicators, any second state indicators, any sub-group state indicators and the encoded non-zero values.

The embodiment may serve to improve compression of activation data that is sparse because it includes a significant number of zero values. For example, the method may be effective when compressing activation data from neural networks that make use of the ReLU activation function.

The groups of data elements, sub-groups of data elements and data elements may form a quad-tree structure. More particularly, in some embodiments, the unit of data may include 64 data elements, the unit of data may be divided into four groups of 16 elements, and the groups may be sub-divided into sub-groups of 4 data elements.

Within the compressed data set, the first state indicators may be grouped in a set of first state indicators and the second state indicators may be grouped as a set of second state indicators. This is referred to in other embodiments as breadth first encoding because the first state indicators for the groups are collected together and the second state indicators for the sub-groups are collected also collected together. Such an arrangement may allow a parser of a neural processing unit to more efficiently parse the compressed data set.

The encoding of the non-zero values of data elements may include delta encoding the non-zero values. For example, the delta encoding may be performed by taking a difference between an actual value of each data element and a prediction value for the data element. The unit of data may include a square number of data elements and a prediction value for each data element on a left-hand edge of the square of data elements, except for a top-left data element, may be equal to the value of the data element in a location one position above the predicted data element. The prediction for data elements on the top row of the square of data elements, except for the top-left data element, may be equal to a value of the data element in a location one position to the left of the predicted data element. The prediction for data elements within the square of data elements may be based on a linear combination of values of the data elements having locations surrounding the data element. In some embodiments, the prediction for data elements within the square of data elements may be based on a linear combination of values of the data elements having locations one position to the left of the data element, one position above the data element and one position diagonally to the upper-left of the data element.

The delta-encoded non-zero values may be encoded as Golomb-Rice codes. In some embodiments, before the delta-encoded non-zero values are converted to Golomb-Rice codes they are converted into an un-signed form, such that all the delta-encoded non-zero values are converted to integers greater than or equal to zero. Golomb-Rice encoding of delta-encoded non-zero values may have the effect of improved compression because the non-zero values are smaller due to the delta encoding and Golomb-Rice codes of lower values are shorter.

In accordance with a second embodiment there is provided a method performed by a processing element for compressing activation data of a neural network to be written to a storage, which activation data is formed of units of data elements, each unit comprising a plurality of data elements and each data element having a numerical value, the method comprising: forming a plurality of groups of data elements within each unit of activation data, each group including a plurality of data elements; identifying whether there are any data elements values within each group that have a zero value and forming a first state indicator for each group that indicates whether that group contains data elements having zero values; forming a plurality of sub-groups within each group of data elements that was identified as containing at least one data element having a zero value; identifying whether there are any data elements having zero value within each sub-group and forming a second state indicator that indicates for each sub-group whether the sub-group contains a data element having a zero value; for each sub-group containing a data element having zero value, forming a sub-group state indicator for that group that indicates which data elements within that sub-group have a zero value; encoding the non-zero values of data elements in the unit of data; and forming a compressed data set comprising the first state indicators, any second state indicators, any sub-group state indicators and the encoded non-zero values.

Some methods implemented in accordance with the second embodiment may be more efficient at compressing slightly sparse activation data that includes some data elements having a zero value but not a large number of data elements having a zero value.

In accordance with a third embodiment there is provided a data processing system comprising a processing element and a storage, the storage storing code portions that, when executed by the processing element, cause the data processing system to perform a method of compressing activation data, wherein the activation data is formed in units of data elements, each unit comprising a plurality of data elements and each data element having a numerical value, the method comprising: forming a plurality of groups of data elements within a unit of activation data, each group including a plurality of data elements; identifying whether there are any data elements within each group that have non-zero value and forming a first state indicator for each group that indicates whether that group contains data elements having a non-zero value; forming a plurality of sub-groups within each group of data elements that was identified as containing at least one data element having a non-zero value; identifying whether there are any data elements having non-zero value within each sub-group and forming a second state indicator that indicates for each sub-group whether the sub-group contains a data element having a non-zero value; for each sub-group containing a data element having a non-zero value, forming a sub-group state indicator for that sub-group that indicates which data elements within that sub-group have a non-zero value; encoding the non-zero values of data elements in the unit of data; and forming a compressed data set comprising the first state indicators, any second state indicators, any sub-group state indicators and the encoded non-zero values.

In accordance with a fourth embodiment there is provided a data processing system comprising a processing element and a storage, the storage storing code portions that, when executed by the processing element, cause the data processing system to perform a method for compressing activation data from a neural network, which activation data is formed of units of data elements, each unit comprising a plurality of data elements and each data element having a numerical value, the method comprising: forming a plurality of groups of data elements within a unit of activation data, each group including a plurality of data elements; identifying whether there are any data elements within each group that have a zero value and forming a first state indicator for each group that indicates whether that group contains data elements having a zero value; forming a plurality of sub-groups within each group of data elements that was identified as containing at least one data element having a zero value; identifying whether there are any data elements having a zero value within each sub-group and forming a second state indicator that indicates for each sub-group whether the sub-group contains a data element having a zero value; for each sub-group containing a data element having zero value, forming a sub-group state indicator for that group that indicates which data elements within that sub-group have zero value; encoding the non-zero values of data elements in the unit of data; and forming a compressed data set comprising the first state indicators, any second state indicators, any sub-group state indicators and the encoded non-zero values.

In accordance with a fifth embodiment there is provided a method performed by a processing element for decompressing compressed activation data of a neural network that is read from a storage, which activation data is formed of units of data elements, each unit comprising a plurality of data elements and each data element having a numerical value, the method comprising: obtaining from the compressed activation data a first state indicator for each of a plurality of groups of data elements within a unit of activation data, each group including a plurality of data elements; assigning to each data element within a group a zero value if the first state indicator indicates that there are no data elements within that group that have a non-zero value; obtaining from the compressed activation data a second state indicator for each of a plurality of sub-groups within each group of data elements if the first state indicator indicates that the group contains at least one data element having a non-zero value; assigning each data element within a sub-group a zero value if the second state indicator indicates that there are no data elements within that sub-group that have a non-zero value; obtaining from the compressed activation data a sub-group indicator for each sub-group for which the second state indicator indicates that data elements within that sub-group have a non-zero value and assigning zero values to data elements within the sub-group in accordance with the sub-group indictor; decoding an ordered set of data elements having non-zero values within the compressed activation data; and forming decompressed activation data by assigning the decoded data elements that have non-zero values to locations that have not been assigned to data elements having a zero value.

The groups of data elements, sub-groups of data elements and data elements within the compressed activation data may form a quad-tree structure. The unit of data may include sixty-four data elements, the unit of data may be divided into four groups of sixteen elements, and the groups may be sub-divided into sub-groups of four data elements.

Within the compressed data set, the first state indicators may be grouped in a set of first state indicators, the second state indicators may be grouped as a set of second state indicators. The first state indicators, second state indicators and sub-state group indicators may be arranged in the compressed data set in one of row major or column major order.

The step of assigning the decoded data elements that have non-zero values to locations that have not been assigned to data elements having a zero value may include assigning the decoded data elements to locations that have not been assigned to data elements having a zero value in one of row major order or column major order.

In accordance with a sixth embodiment there is provided a method performed by a processing element for decompressing compressed activation data of a neural network that is read from a storage, which activation data is formed of units of data elements, each unit comprising a plurality of data elements and each data element having a numerical value, the method comprising: obtaining from the compressed activation data a first state indicator for each of a plurality of groups of data elements within a unit of activation data, each group including a plurality of data elements; obtaining from the compressed activation data a second state indicator for each of a plurality of sub-groups within each group of data elements if the first state indicator indicates that the group contains at least one data element having a zero value; obtaining from the compressed activation data a sub-group indicator for each sub-group for which the second state indicator indicates that the sub-group contains a data element that has a zero value and assigning a zero value to data elements within the sub-group in accordance with the sub-group indictor; decoding an ordered set of data elements having non-zero values within the compressed activation data; and forming decompressed activation data by assigning the decoded data elements that have non-zero values to locations that have not been assigned to data elements having a zero value.

In accordance with a seventh embodiment there is provided a data processing system comprising a processing element and a storage, the storage storing code portions that, when executed by the processing element, cause the data processing system to perform a method for decompressing compressed activation data, which activation data is formed of units of data elements, each unit comprising a plurality of data elements and each data element having a numerical value, the method comprising: obtaining from the compressed activation data a first state indicator for each of a plurality of groups of data elements within a unit of activation data, each group including a plurality of data elements; assigning to each data element within a group a zero value if the first state indicator identifies that there are no data elements within that group that have a non-zero value; obtaining a second state indicator from the compressed activation data for each of a plurality of sub-groups within each group of data elements if the first state indicator indicates that the group contains at least one data element having a non-zero value; assigning each data element within a sub-group a zero value if the second state indicator indicates that there are no data elements within that sub-group that have a non-zero value; obtaining a sub-group indicator from the compressed activation data for each sub-group for which the second state indicator indicates that data elements within that sub-group have a non-zero value and assigning zero values to data elements within the sub-group in accordance with the sub-group indictor; decoding an ordered set of data elements having non-zero values within the compressed activation data; and forming decompressed activation data by assigning the decoded data elements that have non-zero values to locations that have not been assigned to data elements having a zero value.

In accordance with an eighth embodiment there is provided a data processing system comprising a processing element and a storage, the storage storing code portions that, when executed by the processing element, cause the data processing system to perform a method for decompressing compressed activation data, which activation data is formed of units of data elements, each unit comprising a plurality of data elements and each data element having a numerical value, the method comprising: obtaining from the compressed activation data a first state indicator for each of a plurality of groups of data elements within a unit of activation data, each group including a plurality of data elements; obtaining from the compressed activation data a second state indicator for each of a plurality of sub-groups within each group of data elements if the first state indicator indicates that the group contains at least one data element having a zero value; obtaining from the compressed activation data a sub-group indicator for each sub-group for which the second state indicator indicates that data elements within that sub-group have a zero value and assigning a zero value to data elements within the sub-group in accordance with the sub-group indictor; decoding an ordered set of data elements having non-zero values within the compressed activation data; and forming decompressed activation data by assigning the decoded data elements that have non-zero values to locations that have not been assigned to data elements having a zero value.

In accordance with a ninth embodiment there is provided a data processing system comprising for compressing activation data, wherein the activation data is formed in units of data elements, each unit comprising a plurality of data elements and each data element having a numerical value, the data processing system comprising processing means configured to: form a plurality of groups of data elements within a unit of activation data, each group including a plurality of data elements; identify whether there are any data elements within each group that have non-zero value and form a first state indicator for each group that indicates whether that group contains data elements having a non-zero value; form a plurality of sub-groups within each group of data elements that was identified as containing at least one data element having a non-zero value; identify whether there are any data elements having non-zero value within each sub-group and form a second state indicator that indicates for each sub-group whether the sub-group contains a data element having a non-zero value; for each sub-group containing a data element having a non-zero value, form a sub-group state indicator for that sub-group that indicates which data elements within that sub-group have a non-zero value; encode the non-zero values of data elements in the unit of data; and form a compressed data set comprising the first state indicators, any second state indicators, any sub-group state indicators and the encoded non-zero values.

In accordance with a tenth embodiment there is provided a data processing system for compressing activation data from a neural network, which activation data is formed of units of data elements, each unit comprising a plurality of data elements and each data element having a numerical value, the data processing system comprising processing means configured to: form a plurality of groups of data elements within a unit of activation data, each group including a plurality of data elements; identify whether there are any data elements within each group that have a zero value and form a first state indicator for each group that indicates whether that group contains data elements having a zero value; form a plurality of sub-groups within each group of data elements that was identified as containing at least one data element having a zero value; identify whether there are any data elements having a zero value within each sub-group and form a second state indicator that indicates for each sub-group whether the sub-group contains a data element having a zero value; for each sub-group containing a data element having zero value, form a sub-group state indicator for that group that indicates which data elements within that sub-group have zero value; encode the non-zero values of data elements in the unit of data; and form a compressed data set comprising the first state indicators, any second state indicators, any sub-group state indicators and the encoded non-zero values.

In accordance with a eleventh embodiment there is provided a data processing system for decompressing compressed activation data, which activation data is formed of units of data elements, each unit comprising a plurality of data elements and each data element having a numerical value, the data processing system comprising processing means configured to: obtain from the compressed activation data a first state indicator for each of a plurality of groups of data elements within a unit of activation data, each group including a plurality of data elements; assign to each data element within a group a zero value if the first state indicator identifies that there are no data elements within that group that have a non-zero value; obtain a second state indicator from the compressed activation data for each of a plurality of sub-groups within each group of data elements if the first state indicator indicates that the group contains at least one data element having a non-zero value; assign each data element within a sub-group a zero value if the second state indicator indicates that there are no data elements within that sub-group that have a non-zero value; obtain a sub-group indicator from the compressed activation data for each sub-group for which the second state indicator indicates that data elements within that sub-group have a non-zero value and assign zero values to data elements within the sub-group in accordance with the sub-group indictor; decode an ordered set of data elements having non-zero values within the compressed activation data; and form decompressed activation data by assigning the decoded data elements that have non-zero values to locations that have not been assigned to data elements having a zero value.

In accordance with an twelfth embodiment there is provided a data processing system for decompressing compressed activation data, which activation data is formed of units of data elements, each unit comprising a plurality of data elements and each data element having a numerical value, the data processing system comprising processing means configured to: obtain from the compressed activation data a first state indicator for each of a plurality of groups of data elements within a unit of activation data, each group including a plurality of data elements; obtain from the compressed activation data a second state indicator for each of a plurality of sub-groups within each group of data elements if the first state indicator indicates that the group contains at least one data element having a zero value; obtain from the compressed activation data a sub-group indicator for each sub-group for which the second state indicator indicates that data elements within that sub-group have a zero value and assign a zero value to data elements within the sub-group in accordance with the sub-group indictor; decode an ordered set of data elements having non-zero values within the compressed activation data; and form decompressed activation data by assigning the decoded data elements that have non-zero values to locations that have not been assigned to data elements having a zero value.

Particular embodiments will now be described with reference to the Figures.

FIG. 2 shows some, but not all, components 2 of a neural processing unit (NPU), which is a specialized chip for performing calculations in connection with artificial intelligence applications and particularly calculations related to neural networks. In other words, the NPU allows hardware acceleration of certain calculations relating the neural networks. The components 2 are components for writing activation values to a DRAM (not shown) external to the NPU.

When performing calculations relating to a neural network, calculations may be performed for each layer of the neural network. These calculations generate output known as activation data, which can be large in volume and needs to be stored before further calculations can be performed using that data. Storing and retrieving activation data from memory can be a relatively slow process due to constraints on data transfer from external memory to the processor. Accordingly, compressing the data from the activation layer using Golomb Rice codes is desirable in order to improve processor performance. Some other approaches to compressing activation data may involve lossy compression. However, such 'lossy' compression can affect the accuracy of the neural network, which may be unacceptable for some applications. The following compression scheme is a lossless scheme, so it is expected to be acceptable for all applications.

The components 2 are configured to process activation data for storage. The activation data is received and grouped into units, in the form of tiles of data. A tile of data is defined as an 8×8 group of elements, where a data element is an 8-bit uncompressed activation data value. The activation data includes a zero-point, which is a global parameter of the activation data that indicates which of unsigned values 0 to 255 to consider as the zero. The zero-point has a value of 8-bits length. The selection of the value of the zero-point can lead to efficient compression of the activation data, but, as this is not relevant to the implementations discussed herein, this will not be discussed further. A processing element in the form of an encoder 20 is configured to compress the received activation data by converting the activation data into Golomb Rice codes. Further steps, which will be described below, are then performed to make the compressed activation data easier to decode.

Figure 3A:
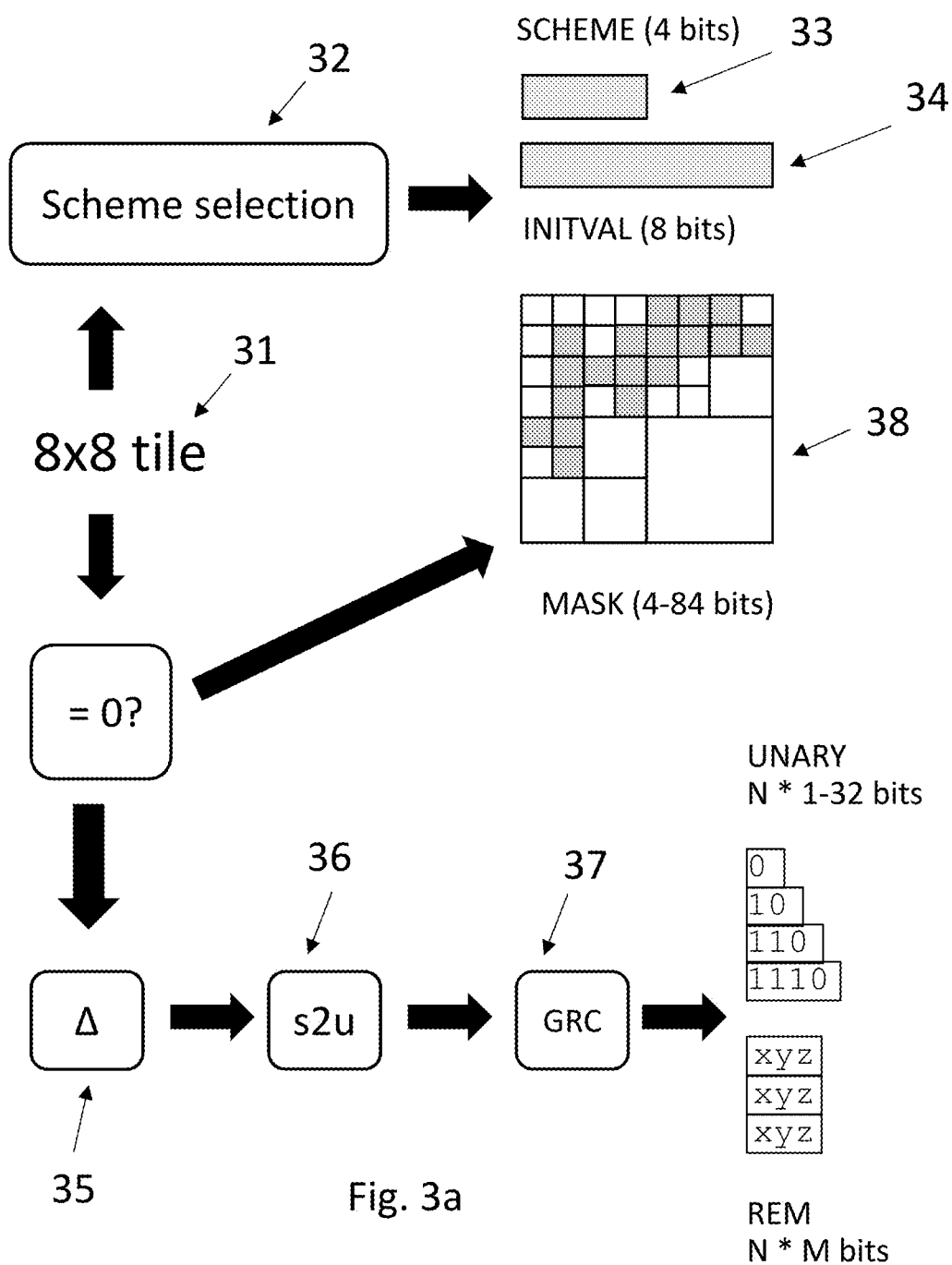
FIG. 3a is a diagram showing steps for compressing activation data.

FIG. 3a shows steps for compressing the activation data. The compression of data is performed on a tile-by-tile basis. Accordingly, a tile 31 is shown as an input. During the compression of the activation data, a scheme selection is performed, 32. The selected scheme 33 is then encoded as 4 bits in the compressed activation data to be sent for storage in the DRAM. The available schemes are shown in FIG. 3b. The 'Raw' scheme is a scheme in which the activation data is simply encoded without any compression being applied. The 'Raw' scheme may be used as a fallback in case of errors. The 'zero' scheme is used if all the activation data values within a tile of activation data have zero value. In this case, the tile can be efficiently compressed by simply indicating the choice of zero scheme, which indicates that all the values within the tile of activation data are zero. Schemes 2 to 6 are for Delta Golomb-Rice encoding. This process will be explained in more detail below. The differences between Delta GRC 1, Delta GRC 2, Delta GRC 3, Delta GRC 4, and Delta GRC 5 are in the value of the divisor used to calculate the Golomb-Rice codes. The Golomb Rice divisor is the number of the scheme, so for Delta GRC 3, the divisor is three. Schemes 7 to 11 are for Mask Delta Golomb-Rice encoding and schemes 12 to 15 are for Inverse Mask Delta Golomb-Rice encoding. These encoding schemes will also be explained in more detail below. Again, the variants within the same type of scheme use different Golomb-Rice code divisors.

Delta Golomb-Rice encoding (schemes 2 to 6) will be explained first. Golomb-Rice codes are variable length codes, which have a smaller size if smaller values are encoded. Accordingly, it is desirable to reduce the numerical values of the data to be encoded where possible. Delta Golomb-Rice encoding makes a prediction of values in a tile of activation data and then determines a difference from the prediction. Only the difference is then encoded, which tends to result in smaller values to encode and therefore better encoding efficiency.

Figure 4:
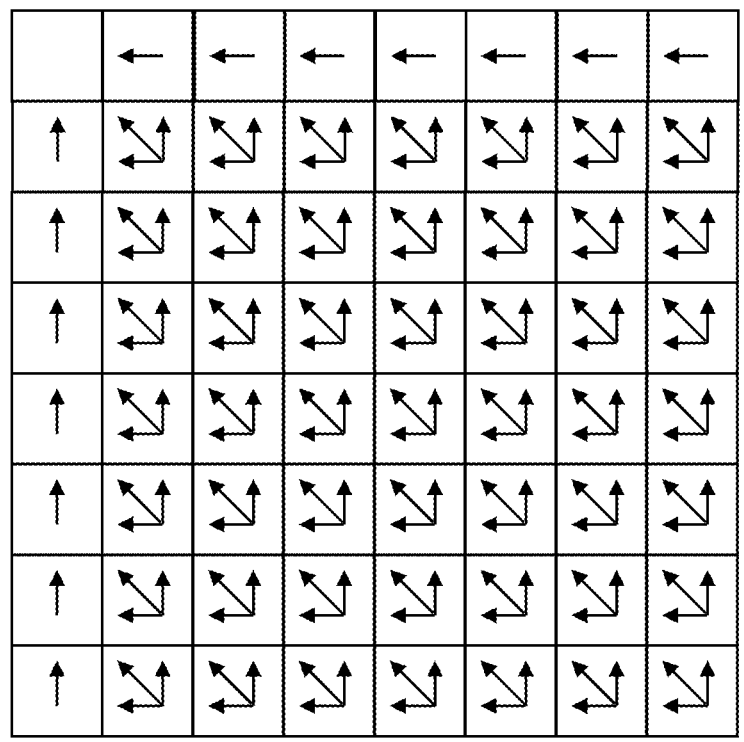
FIG. 4 illustrates logic of a prediction scheme used for delta-encoding activation data.
Figure 4:
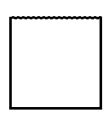
Figure 4:
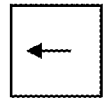
Figure 4:
Figure 4:

FIG. 4 illustrates how the predictions for a tile of data are made. An 8×8 tile of data 31 has values elem [i][j] where i is the vertical coordinate and j is the horizontal coordinate. The top left most data element in a tile is elem [0][0]. The prediction for each entry in the tile is pred [i][j] where i is the vertical coordinate and j is the horizontal coordinate. A difference value, delta [i][j], is the difference between elem [i][j] and pred [i][j].

$$\text{delta}[i][j] = \text{elem}[i][j] - \text{pred}[i][j]$$

In order to calculate pred [i][j] the following scheme is used. As shown in FIG. 4, elements on the left side of the tile are predicted using the data element located one position above. This applies to all left edge elements except the top-left element.

$$\text{pred}[i][j] = \text{elem}[i-1][j] \text{ where } j=0 \text{ and } i \neq 0$$

Elements of pred [i][j] on the top row are predicted using the data element located one position to the left. This applies to all top elements except the top-left element.

$$\text{pred}[i][j] = \text{elem}[i][j-1] \text{ where } i=0 \text{ and } j \neq 0$$

For the remaining elements of pred [i][j], except the top-left element, the prediction is made using a weighted combination of the data element located one position to the left, the data element located on position diagonally to the upper-left, and the data element located above the predicted element.

$$\text{pred}[i][j] = 3*\text{elem}[i][j-1] + 2*\text{elem}[i-1][j-1] + 3*\text{elem}[i-1][j] >> 3$$

The above formula indicates that the left-side and upper data element values are multiplied by three and the upper-left data element is multiplied by two in the linear combination. The last feature (>>3) indicates that the calculation is done in binary and represents a bit shift of 3 places. This has the effect of dividing by 8, while maintaining an integer value for pred [i][j].

The top left most data value isn't predicted and is stored in raw format. This data value forms the 8-bit initval 34 shown in FIG. 3a.

A worked example of the delta encoding will now be provided with reference to FIG. 5. As noted above, the delta encoding is performed on 8×8 tiles of activation data. However, to keep the description concise an explanation of delta encoding on a 4×4 grid of data will be given. The top grid of data shown in FIG. 5 is the original data for delta encoding. This data forms elem [i][j] as described above.

In the middle grid of data, the predicted values, pred [i][j], are shown. As the top row of the elem [i][j] data is all zero values, the pred [i][j] values on the top row are also all zero values. Looking at the left column, there is a single non-zero value in the elem data. Pred [3][0] is equal to elem [2][0], which has a value of 1.

Looking at the values away from the left and top edges, calculation of the three non-zero values in pred [i][j] will be explained. Pred [3][2] has a value of 4 and is calculated as follows:

$$\text{pred}[3][2] = 3*0 + 2*0 + 3*11 >> 3$$

$$= 33 >> 3$$

$$= 100001 >> 3$$

$$= 100$$

$$= 4$$

Pred [2][3] has a value of 5 and is calculated as follows:

$$\text{pred}[2][3] = 3*11 + 2*0 + 3*3 >> 3$$

$$= 40 >> 3$$

$$= 101000 >> 3$$

$$= 101$$

$$= 5$$

Pred [3][3] has a value of 19 and is calculated as follows:

$$\text{pred}[3][3] = 3*23 + 2*11 + 3*22 >> 3$$

$$= 157 >> 3$$

$$= 10011101 >> 3$$

$$= 10011$$

$$= 19$$

The bottom grid of data in FIG. 5 is delta [i][j] and this is simply the difference between elem [i][j] and pred [i][j]. The values of delta [i][j] are smaller than those of elem [i][j], which is helpful for efficient Golomb-Rice encoding.

In the delta Golomb-Rice code schemes (schemes 2 to 6) the data values delta [i][j] are converted to Golomb-Rice codes. However, in order to do this, it is preferable that all the values to be encoded are positive as this avoids the need to use a sign bit. Accordingly, a signed to un-signed conversion is performed as follows:

$$u\text{delta}[i][j] = \text{delta}[i][j] < 0 ? -2*\text{delta}[i][j] - 1 : 2*\text{delta}[i][j]$$

The logic here is that the if delta [i][j] is zero, udelta [i][j] is zero. Otherwise, positive values of delta[i][j] are doubled and negative values of delta [i][j] are multiplied by −2 and have 1 subtracted from them. This maps positive delta [i][j] values to even numbers on the positive axis and negative delta [i][j] values to odd numbers on the positive axis. The values of udelta [i][j] are then Golomb-Rice encoded.

As mentioned previously, the difference between the schemes 2 to 6 in FIG. 3b is the value of the divisor used to generate the Golomb-Rice codes. Once the values of udelta [i][j] have been converted to Golomb-Rice codes, the compressed data is formed of a scheme value (4 bits), an initial value (initval) corresponding to the top-left data element (elem [0][0]), and the Golomb-Rice codes corresponding to udelta[i][j].

The Mask Delta Golomb-Rice encoding schemes (schemes 7 to 11) will now be described. These schemes include a mask encoding step in addition to the delta encoding step. Referring to FIG. 3 the Mask Delta Golomb-Rice encoding includes delta encoding 35, the signed to unsigned conversion 36, the conversion to Golomb-Rice codes 37 and an additional mask encoding step 38.

Figure 6:
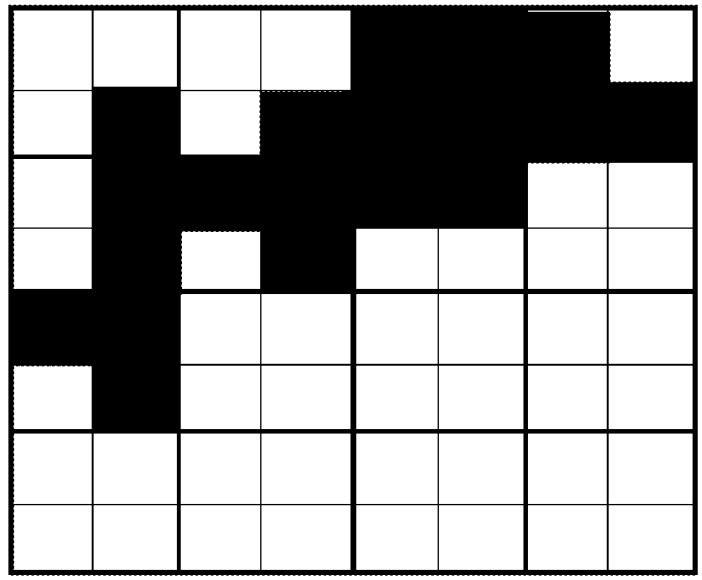
FIG. 6 shows a worked example of mask-encoding of activation data.

FIG. 6 illustrates the masking process. The top of FIG. 6 shows a grid in which each square cell represents a data element of an 8×8 tile of activation data. Many neural networks produce activation data that includes many zero values. For example, neural networks my use the ReLU activation function, which tends to produce sparse activation maps. The zero values are shown in the grid in FIG. 6 as unfilled cells, whereas activation data values having any non-zero value are shown as filled in. It can be seen from the sparse example in FIG. 6, that there are many zero values. The masking process provides a way to encode the location of the zero values as will now be explained.

A first mask is generated by considering the 8×8 grid as a collection of groups of data elements in the form of four 4×4 grids: a top-left 4×4 grid, a top-right 4×4 grid, a bottom-left 4×4 grid and a bottom-right 4×4 grid. Each 4×4 grid is examined to see if there are any non-zero values. In the example shown in FIG. 5, there are non-zero values in each of the top-left, top-right and bottom-left grids. However, the bottom right 4×4 grid does not include any non-zero values. Accordingly, a 4×4 mask is formed [1110]. A first state indicator in the form of a bit value '1' specifies that the 4×4 grid that will be further sub-divided because it contains non-zero values and a first state indicator in the form of a bit value '0' indicates a 4×4 grid in which all data elements have a zero value.

For each 4×4 grid that includes non-zero values, sub-groups in the form of 2×2 grids are formed: top-left, top-right, bottom-left and bottom-right. Each of these sub-grids are examined to see if they contain non-zero values. The process is performed in row-major order across the 4×4 grids that were found to have non-zero values. For the top-left 4×4 grid, each 2×2 grid includes a non-zero valued element. Accordingly, the 2×2 mask for that grid is [1111]. A second state indicator in the form of a bit value '1' specifies a 2×2 grid that is further sub-divided because it contains at least one non-zero value and a second state indicator in the form of a bit value '0' represents that all the data elements in the 2×2 grid have the a zero value. The top-right 4×4 grid includes a single 2×2 grid with no non-zero elements in the lower right. Accordingly, the 2×2 mask for that 4×4 grid is [1110]. Looking at the bottom-left 4×4 grid, only the upper-left 2×2 grid contains non-zero values. Accordingly, the 2×2 mask for that 4×4 grid is [1000]. This gives the 2×2 mask shown in FIG. 5 of [111111101000]. Note that the line breaks in the 2×2 mask illustrated below the grid shown in FIG. 5 illustrate a break between the top row and the bottom row for ease of reading.

For those 2×2 grids that include non-zero values, a sub-group indicator in the form of a 1×1 mask is created which shows the position of zero and non-zero values within each 2×2 grid. This is done in row-major order for each 4×4 grids, so the upper-left 2×2 grid in the upper left 4×4 grid is encoded as [0001], the upper-right 2×2 grid is encoded [0001], the lower left 2×2 grid is encoded [0101], and the lower-right 2×2 grid is encoded [1101]. A '1' specifies a data element having a value different from the zero point and a '0' indicates a value equal to the zero point. The line breaks in the 1×1 mask in FIG. 5 show the 1×1 masks in the different 4×4 grids (upper-left, upper-right, and lower-left). The total mask encoding is a concatenation of the 4×4 mask, the 2×2 mask and the 1×1 mask.

Once the zero values have been encoded in the mask, as described above, the non-zero values still need to be encoded so that their value as well as their location is included in the compressed activation data. This is done in a similar way to that described in the delta encoding explained with reference to FIG. 4. However, rather than calculating delta-values for all data elements within a tile, delta values are only calculated for the non-zero values. For each non-zero value pred [i][j] is calculated and a difference value, delta [i][j], is calculated. The values delta [i][j] are unsigned by conversion to udelta [i][j] as described above and then converted to Golomb-Rice codes using the divisor specified for the selected scheme (Mask Delta GRC1 to Mask Delta GRC 5).

The compressed activation data for the Mask Delta GRC schemes consists of a scheme identifier (4 bits), the initial value for the delta encoding (initval, 8 bits), and the mask encoding that encodes the location of the zero values. The mask encoding is the 4×4 mask (4 bits), 2×2 masks (bit count=4*bit count of 4×4 grid), and 1×1 masks (bit count=4*bit count of 2×2 grids). A feature of this form of mask is that everything is 4 bit aligned which makes subsequent parsing to decompress the activation data by an NPU easier.

The Inverse Mask Delta Golomb-Rice encoding schemes (schemes 12 to 15) will now be described. These schemes are closely related to the Mask Delta Golomb-Rice encoding schemes. In the Mask Delta Golomb-Rice encoding schemes described above, the locations of non-zero values are indicated in the 4×4 and 2×2 masks. If, however, there are more non-zero values than zero values, it may be more efficient to encode the locations of the zero values within the tile rather than the positions of the non-zero values. The same data grid illustrated in FIG. 6 will be used in FIG. 7 to describe the Inverse Mask Delta Golomb-Rice encoding. The explanation will also demonstrate that, when zero values are more common than non-zero values, the Mask Delta Golomb-Rice encoding is more efficient than Inverse Mask Delta Golomb-Rice encoding.

Figure 7:
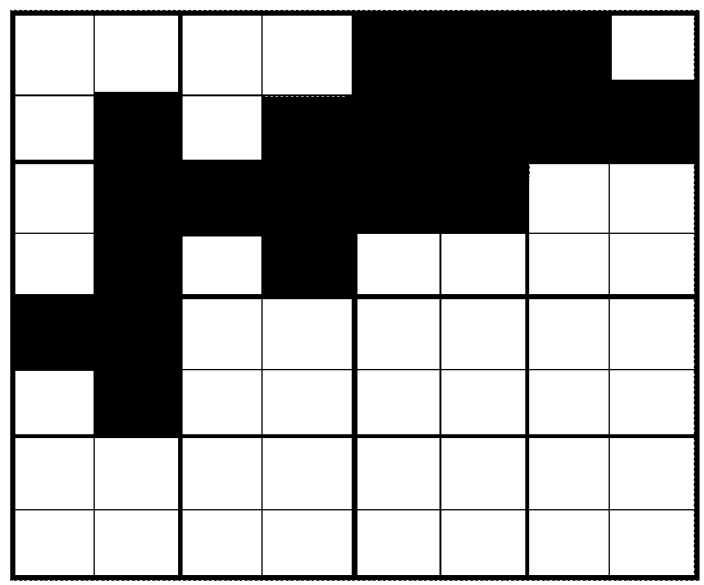
FIG. 7 shows a worked example of inverse mask-encoding of activation data.

Looking at FIG. 7, the same process as described for FIG. 6 will be performed except rather than determining if there are any non-zero values in each 4×4 grid it is determined if there are any zero values in each 4×4 grid. As before a top-left 4×4 grid, a top-right 4×4 grid, a bottom-left 4×4 grid and a bottom-right 4×4 grid are considered. Each 4×4 grid is examined to see if there are any zero values. In the example shown in FIG. 7, there are zero values in all the grids. Accordingly, a 4×4 mask is formed [1111]. A '1' bit value indicates that there is a zero value within the 4×4 grid and that the grid will be sub-divided and a '0' value indicates that the 4×4 grid is formed solely of non-zero values.

For each 4×4 grid that includes zero values, 2×2 grids are formed: top-left, top-right, bottom-left and bottom-right. Each of these 2×2 grids are examined to see if they contain zero values. The process is performed in row-major order across the 4×4 grids that contain zero values. A '1' bit value indicates that there is a zero value within the 2×2 grid and a '0' value indicates that the 2×2 grid is formed solely of non-zero values. For the top-left 4×4 grid, each 2×2 grid includes a zero-valued element. Accordingly, the 2×2 mask for that grid is [1111]. The top-right 4×4 grid includes a single 2×2 grid with no zero valued elements in the top-left corner. Accordingly, the 2×2 mask for that 4×4 grid is [0111]. Looking at the bottom-left 4×4 grid, all the 2×2 grids have zero valued date elements. Accordingly, the 2×2 mask for that 4×4 grid is [1111]. Further, the bottom-right 4×4 grid includes zero-valued elements in each 2×2 grid. This gives a mask for the bottom-right 4×4 grid of [1111]. This gives the 2×2 mask shown in FIG. 7 of [1111011111111111]. Note that the line breaks in the 2×2 masks shown below the grid in FIG. 7 illustrate a break between the top row and the bottom row.

For those 2×2 grids that include zero valued data elements, a 1×1 mask is created which shows the position of the zero values and non-zero values within each 2×2 grid. This is done in row-major order for each 4×4 grid starting with the upper-left 4×4 grid. In the upper-left 4×4 grid, the upper-left 2×2 grid is encoded as [1110], the upper-right 2×2 grid is encoded [1110], the lower left 2×2 grid is encoded [1010] and the lower-right 2×2 grid is encoded [0010]. The line breaks in the 1×1 mask in FIG. 7 show the 1×1 masks in the different 4×4 grids (upper-left, upper-right, lower-left, and lower-right). A '1' value indicates a zero value and a '0' value indicates a non-zero value. The total mask encoding is a concatenation of the 4×4 mask, the 2×2 mask and the 1×1 mask.

As with the mask delta Golomb-Rice encoding, the non-zero values are delta encoded in the same was as described in connection with FIG. 4. However, rather than calculating delta-values for all data elements within a tile, delta values are only calculated for the non-zero values. For each non-zero value pred [i][j] is calculated and a difference value, delta [i][j], is calculated. The values delta [i][j] are unsigned by conversion to udelta [i][j] as described above in connection with Delta Golomb-Rice encoding and then converted to Golomb-Rice codes using the divisor specified for the selected scheme (Inverse Mask Delta GRC1 to Inverse Mask Delta GRC 5).

The compressed activation data is made up of the scheme identifier (4 bits), the initial value for the delta encoding (8 bits) and the inverse mask described above.

As explained in connection with FIG. 2, a choice is made between the different encoding schemes is made based on which scheme is the most efficient to encode the tile of activation data. The decision can be made by a deterministic process (i.e. calculating the length of the bits stream that will be created using each scheme). The bit counts are:

Golomb-Rice bit count+scheme bits+initvalDelta encoded bit count:

mask bit count+Golomb-Rice bit count (non-zero elements)+scheme bits+initval     Mask Delta bit count:

inverse mask bit count+Golomb-rice bit count (non-zero elements)+scheme bits+initvInverse Mask Delta bit count:

Compression of the activation data using one of Delta Golomb-Rice encoding, Mask Delta Golomb-Rice encoding, and Inverse Mask Delta Golomb-Rice encoding (schemes 2 to 15 shown in FIG. 3b) generates Golomb-Rice codes and other data. The other data, which is scheme bits and initval or scheme bits, initval and mask data, will be referred to as SIM data below.

Generally speaking, the delta Golomb-Rice encoding is efficient for slowly varying activation data, the mask delta Golomb-Rice encoding is efficient for sparse data including many zero values, and inverse mask delta Golomb-Rice encoding is efficient for data having some sparsity. For example, inverse mask delta Golomb-Rice encoding may be effective if there are more than 32 non-zero values in the tile of activation data, otherwise it is likely that Masked Delta Golomb Rice encoding will be more effective.

When decoding variable length codes, such as Golomb Rice codes, it is difficult to parse at high rates. This is because there is a serial dependency between Golomb Rice codes, such that the length of the preceding Golomb Rice code needs to be known before the next Golomb Rice code can be identified and decoded. Accordingly, a typical hardware implementation to decode Golomb Rice codes might achieve a rate of 1 or 2 Golomb Rice codes per clock cycle when directly parsing using a single parser. For this reason, the Golomb-Rice codes and SIM data are further processed before storage in the DRAM as will now be described.

Figure 8:
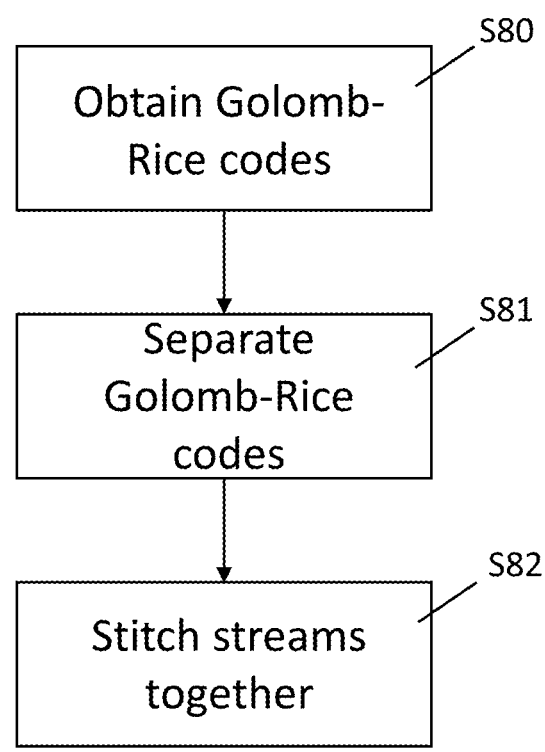
FIG. 8 is a flow chart showing steps in a method of processing activation data.

FIG. 8 is a flow chart showing steps performed by the encoder 20 on the compressed activation data. In step S80, the Golomb Rice codes for each tile of activation data are obtained, in this case by conversion by the encoder 20. Then, in step S81, the encoder 20 separates the Golomb Rice codes into a stream of unary values and a stream of remainder values and stores them in a RAM 21 shown in FIG. 2.

Figure 9:
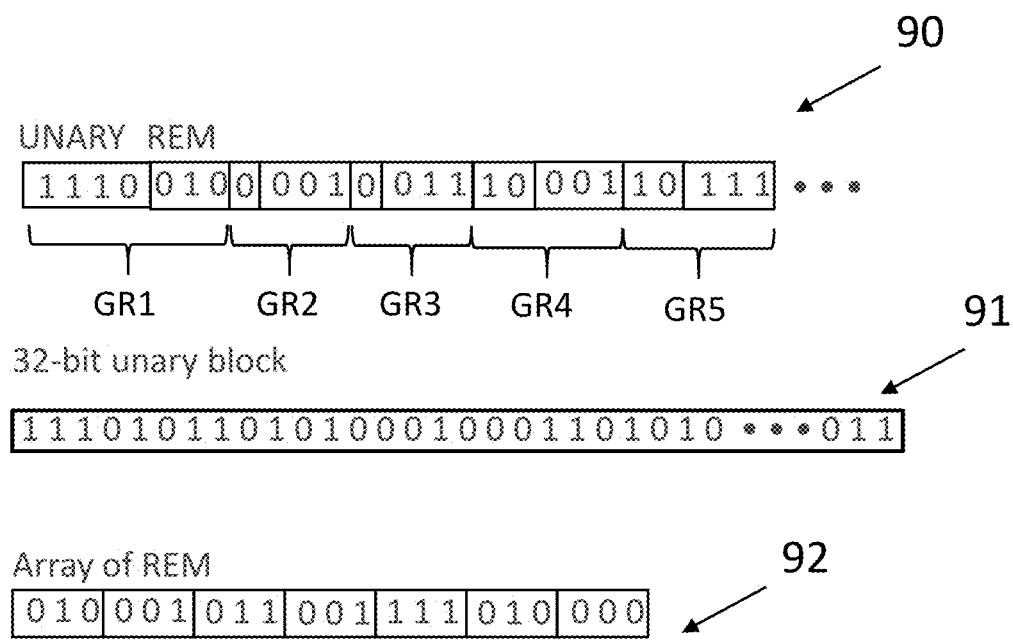
FIG. 9 illustrates separation of Golomb-Rice codes into streams.

FIG. 9 shows three data streams. A source data stream 90 that is a stream of Golomb Rice codes. The source data stream 90 includes a series of Golomb Rice codes which are indicated by the values GR1 to GR5. Each Golomb Rice code has a variable length unary part and a fixed length binary part of the type described in the description of related technology. Although a three-bit fixed length binary part is illustrated in FIG. 9, the length of the binary part is not important and other lengths could be used. The encoder 20 divides the Golomb Rice codes into two parts to generate two further streams 91 and 92 shown in FIG. 9. The first stream 91 is a unary stream and the second stream 92 is a stream of remainders, each binary value having a fixed length.

In step S82, a stitch processor 22, shown in FIG. 2, stitches together the first stream, the second stream and a stream of SIM data to form a processed stream. This is done on a cell-by-cell basis where each cell represents 32 tiles of uncompressed data (2,048 elements) stored in a 2112-byte slot. The slot is larger than the cell in order to allow some overhead and to round up to a whole number of 64 bytes.

Each cell is formed by the stitch processor 22 in a plurality of chunks. A first chunk of a cell always includes a header. The unary data from the stream 90 is always stitched into the chunks of the processed stream by the stitch processor 22 in portions of 32 bits.

Figure 10:
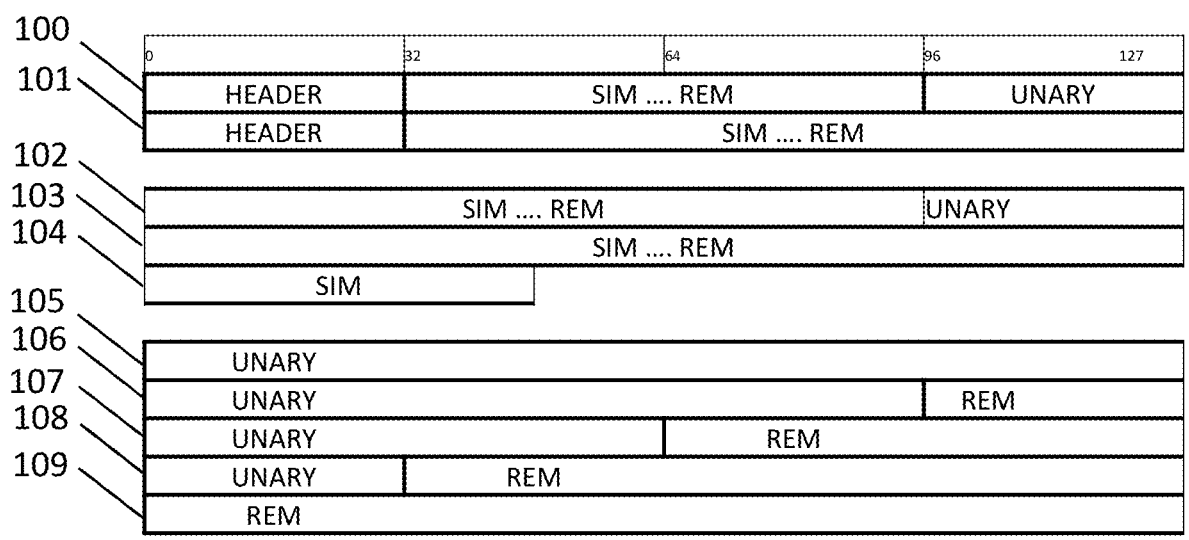
FIG. 10 shows a plurality of chunk structures for use in encoding activation data for storage.
Figure 11:
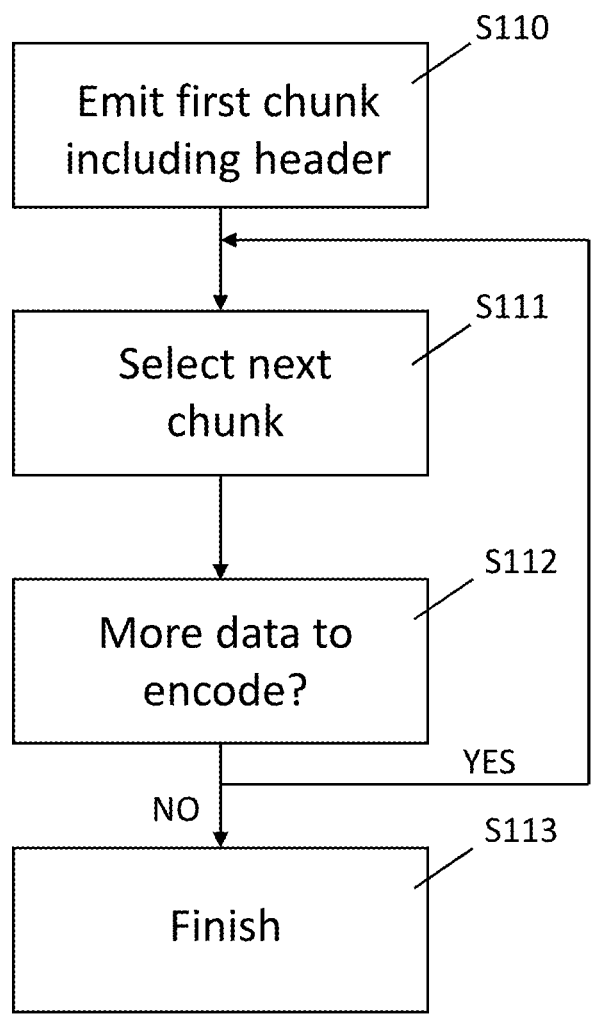
FIG. 11 is a flow chart showing steps of a method for encoding activation data for storage.

The cell is formed by the stitch processor 22 using a set of flow control rules as will now be described with reference to FIGS. 10 and 11. FIG. 10 shows different structures of chunks that the stitch processor 22 may use to form the cell and FIG. 11 shows steps to be performed by the stitch processor 22 when forming a cell.

As mentioned above the first chunk of a cell must include a header, which provides information on the length of the cell and the length of the unary sub-stream included within the cell. The length of the remainder values within the cell is not included in the header but can be derived from the length of the cell and the length of the unary sub-stream.

FIG. 10 shows available chunk formats that have been designed, for parse efficiency, to allow each chunk to be consumed in a single clock cycle of a decoder that decodes the Golomb-Rice codes. The chunk structures shown are split into three categories: the first two chunk structures 100 and 101 are for use when selecting a first chunk in a cell, the next three chunk structures 102 to 104 are for use when sending a first chunk in a tile and the bottom five chunk structures 105 to 109 are extension chunks for use when otherwise emitting unary and remainder data. The top two chunk structures 100 and 101 include a header portion of 32-bit length, which is needed at the start of a cell. The chunk structures 102 to 104 that form the first chunk encoding a new tile within cell include SIM data at the front of the chunk, which may be followed by remainder data and/or unary data.

In order to select an appropriate chunk structure to use, the encoder 20 uses a set of flow control rules. Once a chunk structure for a chunk has been identified the chunk structure can be populated with the appropriate data and emitted. The flow control rules used by the stitch processor 22 are as follows. When selecting a first chunk structure for a cell, the first chunk structure 100 shown in FIG. 10 is selected if there are fewer than 64 bits of SIM data to be transmitted in connection with the first tile of the cell, there are at least 32 bits of unary data available for the first tile of the cell and the combined size of the SIM data and the remainder data for the first tile of the cell is at least 64 bits. Otherwise, the second first chunk structure 101 is used to form the first chunk of the cell. The chunk structure portions labelled 'SIM . . . . REM' in FIG. 10 are initially filled with SIM data until no SIM data remains and then are subsequently filled with remainder data to fill the allocated bits within the chunk.

For chunks in the cell, emitted by the encoder 20 after the first chunk has been emitted, that still contain compressed activation data related to the first tile in the cell, the extension chunks 105 to 109 are used. If there is unary data for the first tile still to be sent and there is more than 128 bits of unary data remaining for inclusion in the cell, chunk structure 105 is used. If there are 96 bits of unary data remaining to be encoded for the cell then chunk structure 106 is used, if there are 64 bits of unary data remaining to be encoded for the cell then chunk structure 107 is used and if there are 32 bits of unary data remaining to be encoded for the cell then chunk structure 108 is used. In a case where all the unary data of the tile has been encoded then chunk structure 109 is used to emit reminder data for the tile including remainder data for the first tile of the cell. It should be noted that the unary data and remainder data included in the above chunk structures is selected regardless of the underlying tile and element groupings of the underlying activation data, such that unary data from different tiles and/or elements may be included in the same chunk.

In a case where all the SIM, unary, and remainder data for the first tile has been included in chunks, a first chunk for the next tile is selected from chunk structures 102 to 104. A value 'CR' representing carried remainder is monitored by the encoder. The carried remainder is a number of remainder bits of the tile that have been emitted in chunk structures before the first chunk for the tile. Similarly, a value 'CU' representing carried unary is monitored by the encoder. The carried unary is a number of unary bits of the tile that have been emitted in chunk structures before the first chunk for the tile. When selecting the first chunk structure for a new tile, chunk structure 102 is selected in a case that the carried remainder is less than a threshold value representing a buffering threshold for remainder values, the carried unary is less than a threshold value representing a buffering threshold for unary values, there are at least 32 bits of unary data remaining to be emitted for the new tile, and the amount of SIM and remainder data remaining to be emitted for the new tile is greater than 96 bits. In this case, because both unary and remainder data can be emitted along with the SIM data, the chunk structure 102 can be used. If the chunk structure 102 is not to be used, and the carried remainder is less than the buffering threshold for remainder values, chunk structure 103 is used to emit SIM data followed by remainder data. Otherwise, chunk structure 104 is used and only SIM data is emitted in the chunk.

The above method for forming a cell of compressed activation data is illustrated in FIG. 11. In step S110, a first chunk structure is selected from chunk structures 100 and 101 shown in FIG. 10. This choice depends on the selection criteria described above. After selecting the chunk structure, the stitch processor 22 creates the header portion. The stitch processor 22 evaluates a length of the unary sub-stream to be included in the cell based on the 32 tiles of uncompressed data and adds information indicating that length to the header portion. The stitch processor 22 evaluates a length of the SIM data sub-stream to be included in the cell based on the 32 tiles of uncompressed data and adds information indicating that length to the header portion. The length of all data to be included in the cell is also evaluated and added to the header portion. Data from the first stream of unary data 41, if required, and data from the second stream of remainder data is added to the chunk in accordance with the selected chunk structure selected by the stitch processor 22.

In step S111, a next chunk of the processed data stream is formed by selecting appropriate the appropriate chunk structure from chunk structures 102 to 109 in accordance with the flow control rules described above. After selecting the chunk structure, the chunk is formed by filling the relevant portions of the chunk structure with data from the first stream of unary data 91, data from the second stream of remainder data 92, and the SIM data.

In step S112, the stitch processor 22 determines whether there is more data to be formed into chunks to complete the cell. If there is more data to be formed into chunks, the method proceeds to S111 to form the next chunk. If there is no more data to be processed, the method proceeds to S113 where it finishes for that cell. The method proceeds for multiple cells until the compressed activation data has been encoded.

The above described method assumes that complete 128-bit chunks can be formed from the 32 tiles in a cell and that the unary portions can be stitched into 32-bit portions. In practice these conditions may not be met, in which case the first stream of unary portions and second stream of remainder portions are padded using the stop bit '0' for padding until they reach the desired size. As the length of data added to the cell is stored in the header it is possible to identify the length of the data within the cell and identify where the padding starts when decoding the processed data stream.

The compressed activation data that has been encoded into cells by the stitch processor 22 is then stored in the DRAM.

Figure 12:
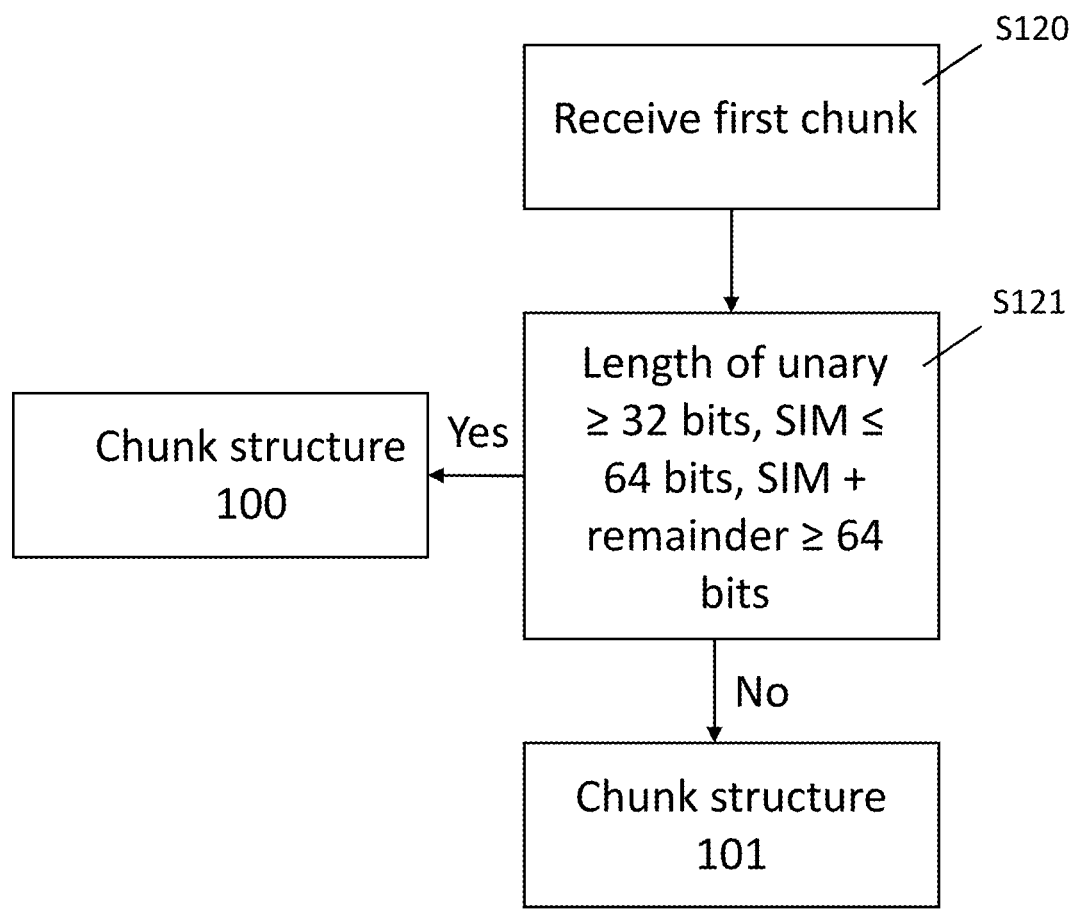
FIG. 12 is a flow chart showing steps for selecting chunk structures for use in decoding activation data.
Figure 13:
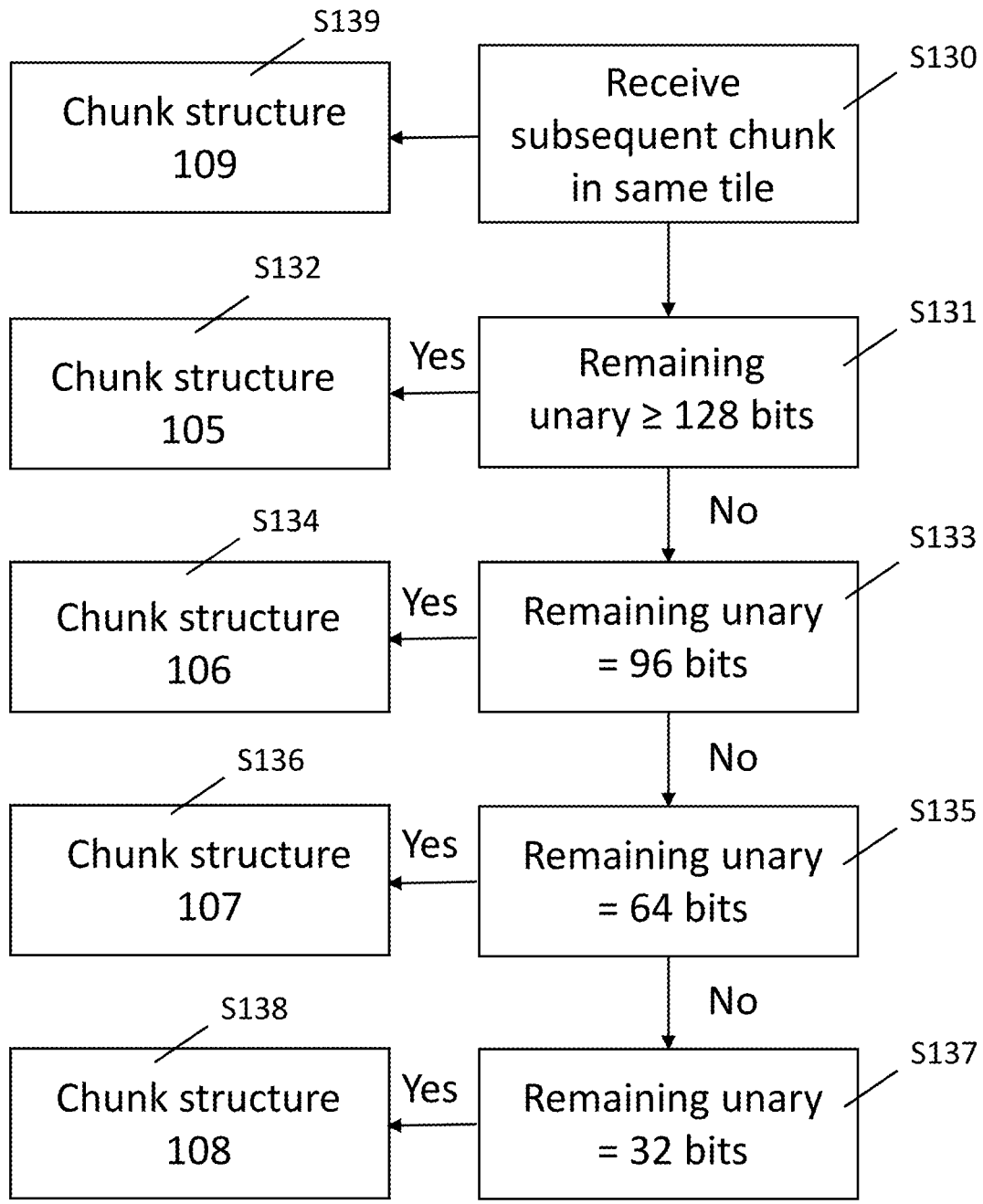
FIG. 13 is a flow chart showing steps for selecting chunk structures for use in decoding activation data.

Next a method of decoding the stored compressed activation data by a decoder will be described with reference to FIGS. 12 to 14. In this case, the decoder is a part of the NPU that allows activation data to be read from the DRAM for use in further calculations. The decoder stores a copy of the chunk structure shown in FIG. 10 that was used by the encoder 20 to store the compressed activation data in the DRAM. In step S120 of FIG. 12, the decoder receives a first chunk of a cell of activation data for decoding from the RAM. The decoder reads the header and identifies the length of unary data in the cell, the length of SIM data in the cell and the total cell length. The decoder also determines the length of remainder in the cell by deducting the length of other components in the cell from the total cell length. In step S121, the decoder identifies whether the length of unary data specified in the header is 32 bits or more, the SIM in the cell is less than 64 bits and the SIM plus remainder data in the cell is greater than 64 bits. If the conditions in S121 are met, the decoder decodes using chunk structure 100. Otherwise, the decoder decodes using chunk structure 101. If, based on the received SIM data, there is data for the first tile remaining, the next chunk will be selected in accordance with the processing shown in FIG. 13. When decoding data, the decoder maintains a parameter U_left, which is initially set to the value of the length of unary in the cell when the header of a cell is examined and is updated each time unary data is retrieved from a chunk to record an amount of unary data remaining in the cell. Accordingly, if chunk structure 100 is used for the first chunk then the parameter U_left will be reduced by 32 after extracting 32 bits of unary data from the first chunk.

At this stage, the decoder has received SIM for a first tile and can determine how many unary words and remainder values it will receive for the first tile. If the decoder determines that there is still data to receive for the first tile, FIG. 13 shows a method used by the decoder for determining the extension chunk structure for the next chunk. In step S130 a subsequent chunk of the stored activation data is received. It is determined whether there is unary data that remains to be emitted for the first tile. If there is unary that remains to be emitted for the first tile the method proceeds to step S131. In step S131 the parameter U_left is examined to determine if the amount of unary data remaining to be extracted for the cell is greater than or equal to 128 bits. If the amount of unary data to be extracted is greater than or equal to 128 bits, the decoder determines that chunk structure 105 is being used. In step S132, the decoder extracts data from the chunk in accordance with chunk structure 105 and updates the parameter U_left to account for the amount of unary data extracted.

If less than 128 bits of unary data remains to be extracted, the method proceeds to step S133. In step S133, the parameter U_left is examined to determine if the amount of unary data remaining to be extracted for the cell is equal to 96 bits. If the amount of unary data to be extracted is equal to 96 bits, the decoder determines that chunk structure 106 is being used. In step S134, the decoder extracts data from the chunk in accordance with chunk structure 106 and updates the parameter U_left to account for the amount of unary data extracted.

If less than 96 bits of unary data remains to be extracted, the method proceeds to step S135. In step S135, the parameter U_left is examined to determine if the amount of unary data remaining to be extracted for the cell is equal to 64 bits. If the amount of unary data to be extracted is equal to 64 bits, the decoder determines that chunk structure 107 is being used. In step S136, the decoder extracts data from the chunk in accordance with chunk structure 107 and updates the parameter U_left to account for the amount of unary data extracted.

If less than 64 bits of unary data remains to be extracted, the method proceeds to step S137. In step S137, the parameter U_left is examined to determine if the amount of unary data remaining to be extracted for the cell is equal to 32 bits. If the amount of unary data to be extracted is equal to 32 bits, the decoder determines that chunk structure 108 is being used. In step S136, the decoder extracts data from the chunk in accordance with chunk structure 108 and updates the parameter U_left to account for the amount of unary data extracted.

If in step S130 the decoder determines that there is no remaining unary for the first tile to be emitted, but that there is remainder data to be emitted for the first tile, the decoder determines that chunk structure 109 is being used. In step S139, the decoder extracts data from the chunk in accordance with chunk structure 109.

Figure 14:
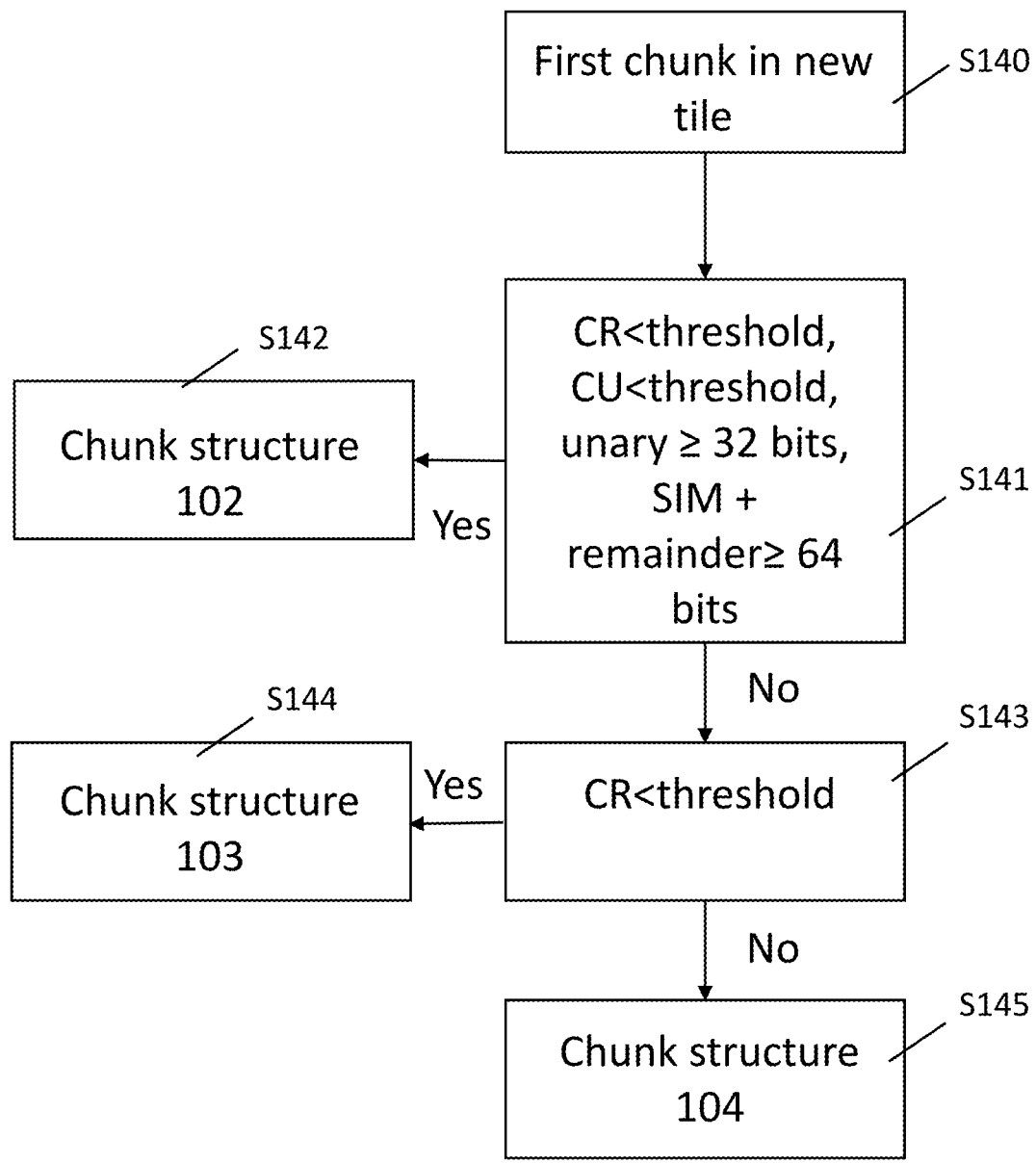
FIG. 14 is a flow chart showing steps for selecting chunk structures for use in decoding activation data.

When the decoder determines, based on received SIM data that all values for a tile have been received, the next chunk structure is determined based on the logic illustrated in FIG. 14. In step S140 it is determined that a first chunk in a new tile is being sent. As with the encoder, the decoder monitors a value 'CR' representing carried remainder. The carried remainder is a number of remainder bits of the next tile that have already been received in chunk structures before the first chunk for the next tile. Similarly, a value 'CU' representing carried unary is monitored by the decoder. The carried unary is a number of unary bits of the next tile that have been received in chunk structures before the first chunk for the next tile.

In step, S141, it is determined whether the carried remainder is less than a buffer value for the carried remainder. The buffer value for the carried remainder is the same as the buffer value for carried remainder used by the encoder. It is also determined whether the carried unary is less than a buffer value for the carried unary. Again, the buffer value for the carried unary is the same as the buffer value for carried unary used by the encoder. The decoder also determines whether there are more than 32 bits of unary data remaining in the cell and whether the amount of SIM plus remainder data in the cell is greater than 64 bits. If all these conditions are met, the decoder decides that the chunk structure 102 is the structure of the next chunk.

If the conditions in step S141 aren't met, the method proceeds to step S143. In S143, if the carried remainder is less than the buffer value for carried remainder, the chunk structure 103 will be used to decode the next chunk of data. Otherwise, chunk structure 104 is used to decode the next chunk of data.

Based on the process described above in connection with FIGS. 12 to 14, the decoder can efficiently recreate the first stream of unary data 41, the second stream of remainder data 42 and the SIM data from the processed stream of data stored in the DRAM by the encoder 20. The steps shown in FIG. 12 are used when decoding a first chunk in a cell and thereafter the logic shown in FIGS. 13 and 14 are used when decoding a first chunk for a new tile or extension chunks as the 32 tiles of data are decoded from the cell. By using the flow control rules shown in FIGS. 12 to 14 the decoder can decide on the type of data that will be found at any point in an incoming stream without a bit cost of indicating the data type within the incoming compressed data stream.

Having extracted the unary and remainder data from the processed data stream, the decoder needs to decode the Golomb-Rice codes to recreate the non-zero values. The second stream 42 of remainder data is an array of fixed length binary values and is straightforward to decode using techniques known in the art. Accordingly, this process is not discussed further here. Decoding the first stream of unary data 91 is described next in connection with FIG. 15a. In a step S150, 8-bit blocks of the unary data are converted into a binary form in which the binary form indicates the position or positions of stop bits within the binary block. This is done by use of a look-up table. In step S151, as unary codes may span across 8-bit blocks, four 8-bit blocks are combined into a 32-bit block and then four 32-bit blocks are combined into a 128-bit block. The 128-bit block is again a list of positions of stop-bit locations. To retrieve the unary values, in step S152, a difference is taken between the values of each neighboring stop-bit location which gives the value of the unary code.

Figure 15A:
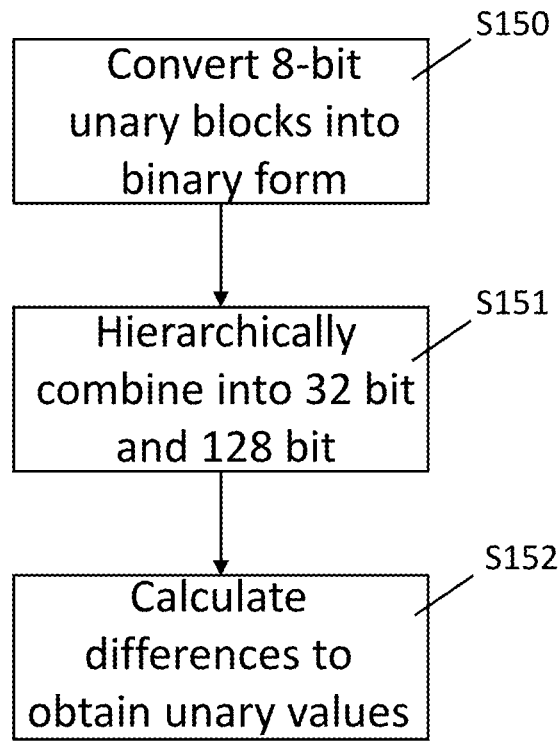
FIG. 15a is a flow chart showing steps of a method for decoding unary data.
Figure 15B:
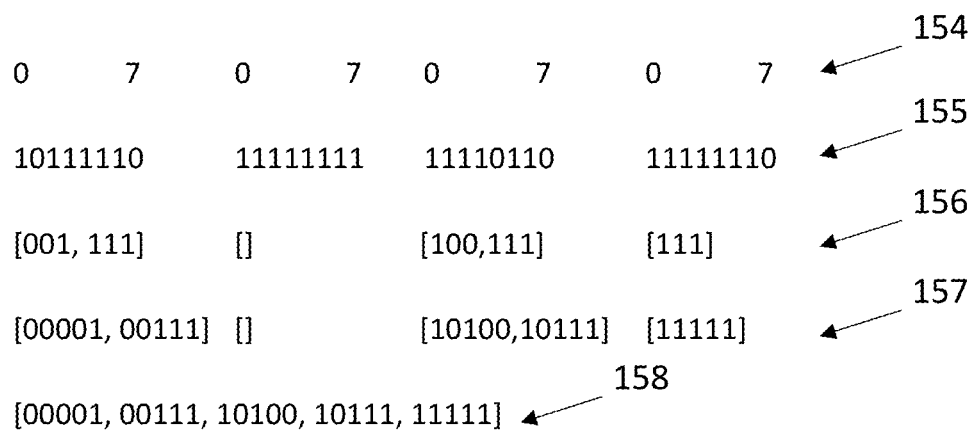
FIG. 15b shows a worked example of decoding unary data.

The method of FIG. 15a may be achieved by using a look-up table to analyze 8-bit blocks of unary data into an intermediate form. This is illustrated in FIG. 15b in which the top row 154 identifies bit positions within each byte illustrated below it. The first bit in each byte is bit '0' and the last bit is bit '7'. The second row 155 shows the bytes of unary data. It is recalled that the stop bits in the unary data are '0'. In the intermediate form, shown in third row 156, each byte is expanded into a list of up to eight 3-bit codes indicating the location of the stop bit within the byte. A Radix-4 combination of four 8-bit segments into 32-bit segments is performed and illustrated in the fourth row 97 and fifth row 98 of FIG. 15b. In the fourth row 157 a pair of identifying bits are added as most significant bits (MSB) to the codes. For the first byte, the values '00' are added to the 3-bit code, for the third byte the values '10' are added to the 3-bit code etc. In the fifth row 158 the 5-bit codes are concatenated to form a list of stop-bit positions within a 32-bit word. A subsequent Radix-4 combination of four 32-bit segments into 128-bit segments generates a list of 7-bit codes indicating locations of unary stop bits using a similar process. As in step S152, subtraction of adjacent values yields the lengths, and hence values, of the unary data.

The recreation of the activation data is performed on a tile-by-tile basis and varies depending on the scheme used to encode the activation data. The scheme can be read from the scheme bits in the SIM data for the tile. The scheme identifier also identifies the divisor used to create the Golomb-Rice codes, thereby allowing the Golomb-Rice codes to be decoded once the length of the unary and the binary remainder have been identified. The values recovered from the Golomb-Rice codes are converted back to signed data values using the following logic:

Delta[i][j]=udelta[i][j]=odd value?−0.5*(udelta[i][j]+1): 0.5udelta[i][j]

The logic is that if udelta [i][j] has an odd value it corresponds to a negative delta [i][j] value. Accordingly, 1 is added to the udelta value and it is multiplied by −0.5. If udelta [i][j] has an even value, it corresponds to a positive delta [i][j] value. The positive delta [i][j] value is recovered as 0.5 times the udelta [i][j] value.

In a case where the activation data has been Delta Encoded (schemes 2 to 6) the original data can be recovered as follows. Referring again to FIG. 4, the top-left value, elem [0][0] is known because it is stored as initval in the SIM data. Based on this value elem [1][0] can be determined in the left-hand column by determining the pred [1][0] is equal to initval and using the formula:

elem[i][j]=delta[i][j]+pred[i][j]

Once elem [1][0] is determined it is then possible to calculate elem [2][0] and so on down the left-hand edge. Similarly, elem [0][1] on the top edge can be determined based on initval and the value delta [0][1] in the compressed activation data. Accordingly, the top row of values of elem [i][j] can be recovered. The remaining values of elem[i][j] can be determined working away from the top-left corner in diagonals.

An order for recovering the values elem [i][j] is shown in FIG. 16. Calculating values along the left-hand edge is done first and is shown in FIG. 16 by the numeral 1. The values along the top edge is done second can also be calculated by starting with elem [0][1] and working along the edge. This is shown in FIG. 16 with the numeral '2'. Once elem [i][j] values are known for the top edge and the left edge of the tile, it becomes possible to determine elem[i][j] for values in diagonals away from the top-left hand corner because the values of elem [i][j] necessary to determine pred [i][j] become known. These calculations are shown in order by numerals '3' to '15' in FIG. 16. In this way the activation data is recovered following the Delta Golomb Rice encoding schemes (schemes 2 to 6).

The process for recovering the masked and inverse masked activation data is similar to that described above for the delta encoded activation data. However, as the zero values are not delta encoded, they are recovered first. In the case of the inverse mask encoding schemes (schemes 12 to 15), the mask indicates the position of the zero values. Accordingly, it is straight forward to identify from the 4×4 mask which 4×4 cells include zero values, which 2×2 cells within the 2×2 cells include zero values and the actual location of the zero values from the 1×1 masks. For the mask schemes (schemes 7 to 11), the locations of the non-zero values are identified from the 4×4, 2×2 and 1×1 masks and the mask is then inverted to identify the positions of the zero values. Once the zero values of elem [i][j] are known, the process of recovering the delta encoded values can be performed as described above in connection with FIG. 16.

As described above, the first particular embodiment combines unary and remainder portions of Golomb Rice codes within cells. Each cell can include both unary and remainder portions. This mixing the unary and remainder portions of the activation data within cells tends to spread unary portions and remainder portions across the processed data stream retrieved from the DRAM. This allows a parse buffer at the decoder for storing unary data before decoding to be reduced in size, thereby reducing hardware requirements.

The above embodiments are to be understood as illustrative. Further embodiments are envisaged. For example, the mask encoding described in connection with FIGS. 6 and 7 encodes the 4×4 grid values first, followed by the 2×2 grid values and then the 1×1 grid values. This is referred to a breadth first traversal because all the 4×4 grids are evaluated first followed by all the relevant 2×2 grids and then the relevant 1×1 values are encoded. An alternative encoding approach is possible, which will be referred to as depth-first traversal. In depth first traversal, each 4×4 tile is considered at each depth level (2×2 and 1×1) before moving on to the next 4×4 grid. For example, for the top-left 4×4 grid shown in FIG. 6, the 4×4 encoding would be 1, because the grid includes a data element having a non-zero value. The next bits in the encoding would be for 2×2 grids and would be [1111] as each 2×2 grid within the top-left grid includes a data element having non-zero value. The next bits in the encoding would be for the 1×1 grids, which would be encoded as [0001000101011101]. Accordingly, the top-left grid would be encoded as [11111100010000101011101]. This would then be followed by the encoding for the top-right 4×4 grid at all depth levels, the bottom-left grid encoded at all depth levels and the bottom-right grid encoded at all depth levels.

A comparison of the depth first encoding described above with the breadth first encoding described in the first embodiment has indicated that the breadth first encoding may be preferable for use in a NPU due to having well aligned 4-bit fields which allows a more efficient parser design.

What is claimed is:

1. A method performed by a processing element for compressing activation data of a neural network to be written to a storage, wherein the activation data is formed of units of data elements, each unit comprising a plurality of data elements and each data element having a numerical value, the method comprising:

forming a plurality of groups of data elements within a unit of activation data, each group including a plurality of data elements;

identifying whether there are any data elements within each group that have a non-zero value and forming a first state indicator for each group that indicates whether that group contains data elements having a non-zero value;

forming a plurality of sub-groups within each group of data elements that was identified as containing at least one data element having a non-zero value;

identifying whether there are any data elements having a non-zero value within each sub-group and forming a second state indicator that indicates for each sub-group whether the sub-group contains a data element having a non-zero value;

for each sub-group containing a data element having a non-zero value, forming a sub-group state indicator for that sub-group that indicates which data elements within that sub-group have a non-zero value;

encoding the non-zero values of data elements in the unit of data; and forming a compressed data set comprising the first state indicators, any second state indicators, any sub-group state indicators and the encoded non-zero values.

2. A method according to claim 1, wherein the groups of data elements, sub-groups of data elements and data elements form a quad-tree structure.

3. A method according to claim 2, wherein the unit of data includes sixty-four data elements, the unit of data is divided into four groups of sixteen elements, and the groups are sub-divided into sub-groups of four data elements.

4. A method according to claim 1 wherein, within the compressed data set, the first state indicators are grouped in a set of first state indicators, the second state indicators are grouped as a set of second state indicators.

5. A method according to claim 4, wherein the first state indicators, second state indicators and sub-state group indicators are arranged in the compressed data set in one of row major or column major order.

6. A method according to claim 1, wherein the encoding of the non-zero values of data elements includes delta encoding the non-zero values.

7. A method according to claim 4, wherein the delta encoding is performed by taking a difference between an actual value of each data element and a prediction value for the data element.

8. A method according to claim 5, wherein the unit of data comprises a square number of data elements and a prediction value for each data element on a left-hand edge of the square of data elements, except for a top-left data element, is equal to the value of the data element in a location one position above the predicted data element.

9. A method according to claim 6, wherein the prediction for data elements on the top row of the square of data elements, except for the top-left data element, is equal to a value of the data element in a location one position to the left of the predicted data element.

10. A method according to claim 7, wherein the predictions for data elements within the square of data elements are based on a linear combination of values of the data elements having locations one position to the left of the data element, one position above the data element and one position diagonally to the upper-left of the data element.

11. A method according to claim 6, wherein the delta-encoded non-zero values are encoded as Golomb-Rice codes.

12. A method according to claim 11, wherein before the delta-encoded non-zero values are converted to Golomb-Rice codes they are converted into an un-signed form, such that all the delta-encoded non-zero values are converted to integers greater than or equal to zero.

13. A method performed by a processing element for compressing activation data of a neural network to be written to a storage, wherein the activation data is formed of units of data elements, each unit comprising a plurality of data elements and each data element having a numerical value, the method comprising:

forming a plurality of groups of data elements within a unit of activation data, each group including a plurality of data elements;

identifying whether there are any data elements values within each group that have a zero value and forming a first state indicator for each group that indicates whether that group contains data elements having zero values;

forming a plurality of sub-groups within each group of data elements that was identified as containing at least one data element having a zero value;

identifying whether there are any data elements having a zero value within each sub-group and forming a second state indicator that indicates for each sub-group whether the sub-group contains a data element having a zero value;

for each sub-group containing a data element having a zero value, forming a sub-group state indicator for that group that indicates which data elements within that sub-group have a zero value;

encoding the non-zero values of data elements in the unit of data; and forming a compressed data set comprising the first state indicators, any second state indicators, any sub-group state indicators and the encoded non-zero values.

14. A data processing system comprising a processing element and a storage, the storage storing code portions that, when executed by the processing element, cause the data processing system to perform a method of compressing activation data of a neural network, wherein the activation data is formed in units of data elements, each unit comprising a plurality of data elements and each data element having a numerical value, the method comprising:

forming a plurality of groups of data elements within a unit of activation data, each group including a plurality of data elements;

identifying whether there are any data elements within each group that have a non-zero value and forming a first state indicator for each group that indicates whether that group contains data elements having a non-zero value;

forming a plurality of sub-groups within each group of data elements that was identified as containing at least one data element having a non-zero value;

identifying whether there are any data elements having non-zero value within each sub-group and forming a second state indicator that indicates for each sub-group whether the sub-group contains a data element having a non-zero value;

for each sub-group containing a data element having a non-zero value, forming a sub-group state indicator for that sub-group that indicates which data elements within that sub-group have a non-zero value;

encoding the non-zero values of data elements in the unit of data; and forming a compressed data set comprising the first state indicators, any second state indicators, any sub-group state indicators and the encoded non-zero values.

* * * * *